(12) United States Patent
Uchiyama et al.

(10) Patent No.: US 10,350,788 B2
(45) Date of Patent: Jul. 16, 2019

(54) METHOD FOR SLICING WORKPIECE AND WORKPIECE HOLDER

(71) Applicant: SHIN-ETSU HANDOTAI CO., LTD., Tokyo (JP)

(72) Inventors: Atsuo Uchiyama, Tomi (JP); Hisakazu Takano, Nagano (JP); Masahito Saitoh, Nagano (JP); Hirotoshi Kouzu, Nagano (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/100,378

(22) PCT Filed: Nov. 27, 2014

(86) PCT No.: PCT/JP2014/005931
§ 371 (c)(1),
(2) Date: May 31, 2016

(87) PCT Pub. No.: WO2015/097985
PCT Pub. Date: Jul. 2, 2015

(65) Prior Publication Data
US 2016/0303765 A1    Oct. 20, 2016

(30) Foreign Application Priority Data

Dec. 24, 2013  (JP) ................. 2013-265726

(51) Int. Cl.
*B28D 5/04* (2006.01)
*B28D 5/00* (2006.01)
(Continued)

(52) U.S. Cl.
CPC ........ *B28D 5/0082* (2013.01); *B24B 27/0633* (2013.01); *B28D 5/045* (2013.01); *H01L 21/304* (2013.01); *H01L 22/12* (2013.01)

(58) Field of Classification Search
CPC .. B28D 5/0082; B28D 27/0633; B28D 5/045; H01L 21/304; H01L 22/12
(Continued)

(56) References Cited

U.S. PATENT DOCUMENTS 5,857,454 A    1/1999  Shibaoka
5,904,136 A    5/1999  Nagatsuka et al.
(Continued)

FOREIGN PATENT DOCUMENTS

CN    1469942 A    1/2004
JP    H03-10760 A   1/1991
(Continued)

OTHER PUBLICATIONS

Jul. 7, 2016 International Preliminary Report on Patentability issued in Patent Application No. PCT/JP2014/005931.
Oct. 21, 2016 Office Action issued in Taiwanese Patent Application No. 103143056.
(Continued)

*Primary Examiner* — Robert A Rose
(74) *Attorney, Agent, or Firm* — Oliff PLC

(57) ABSTRACT

Method for slicing a workpiece, including measuring a crystal axis orientation while holding a workpiece with a workpiece holder, setting the workpiece holder to a wire saw in such a manner that the measured crystal axis orientation is maintained, then adjusting a sliced plane orientation, pressing the workpiece against a wire row to slice the workpiece; the workpiece holder includes a portion slidable while holding the workpiece and a portion for fixing the slide portion, after measuring the crystal axis orientation, sliding the slide portion to move to the workpiece holder center in a manner that the measured crystal axis orientation is maintained, fixing the slide portion, setting the workpiece holder to the wire saw, then adjusting the sliced plane orientation, and slicing the workpiece. This enables an orientation measurement without limitation of distance between an orientation measuring instrument and plane to be measured can inhibit warpage deterioration and workpiece breakage.

14 Claims, 9 Drawing Sheets

(51) Int. Cl.
　　　*B24B 27/06*　　　(2006.01)
　　　*H01L 21/304*　　(2006.01)
　　　*H01L 21/66*　　 (2006.01)

(58) Field of Classification Search
　　　USPC ........................ 125/21, 16.02; 451/168, 296
　　　See application file for complete search history.

(56) References Cited

U.S. PATENT DOCUMENTS

| | | |
|---|---|---|
| 6,941,940 B1 | 9/2005 | Zavattari et al. |
| 2004/0118338 A1 | 6/2004 | Hammer et al. |
| 2009/0084373 A1 | 4/2009 | Oishi |

FOREIGN PATENT DOCUMENTS

| | | |
|---|---|---|
| JP | H09-019920 A | 1/1997 |
| JP | H09-314547 A | 12/1997 |
| JP | H09-325124 A | 12/1997 |
| JP | 2000-171417 A | 6/2000 |
| JP | 2001-050912 A | 2/2001 |
| JP | 2003-534939 A | 11/2003 |
| JP | 2007-090466 A | 4/2007 |

OTHER PUBLICATIONS

Mar. 3, 2015 Search Report issued in International Patent Application No. PCT/JP2014/005931.
Jan. 29, 2018 Office Action issued in Chinese Application No. 201480067818.3.
Aug. 7, 2018 Office Action issued in Chinese Application No. 201480067818.3.

METHOD FOR SLICING WORKPIECE AND WORKPIECE HOLDER

TECHNICAL FIELD

The present invention relates to a method for slicing a workpiece with a wire saw and to a workpiece holder used in the method.

BACKGROUND ART

When a workpiece is sliced into wafers with a wire saw, slicing is performed so that the sliced plane has a predetermined orientation. The slicing method begins with measuring an axis orientation of the workpiece while holding and fixing the workpiece with a workpiece holder. On the basis of the data of the measured axis orientation, the workpiece holder is fixed to a wire saw, the workpiece position is adjusted, and the workpiece is then sliced such that the crystal axis orientation of the workpiece coincides with a desired plane orientation of the wafer. The plane orientation of the sliced plane of the workpiece is adjusted by a combination of a rotating motion around an axis perpendicular to a central axis between the bottoms of the cylindrical workpiece in a plane parallel to the wire row and a swinging motion of the central axis between the bottoms relative to the wire row plane. Such a method for adjusting a crystal plane orientation of a workpiece is referred to as an internal setup manner.

In slicing of a workpiece, it has been known that making a wire travel at an angle furthest from a crystal habit line such as a notch and an OF (Orientation Flat) to slice the workpiece is effective in inhibiting cracks and other detects of wafers (see Patent Document 1).

In addition to the internal setup manner, there is an external setup manner in which, when a workpiece is fixed to a workpiece holder, the orientation is adjusted by rotation of the workpiece around a central axis passing through midpoints of bottoms of the workpiece and pivot in a plane parallel to the wire row plane. In the external setup manner, a plane orientation of the workpiece is not adjusted in the wire saw.

By contrast, the internal setup manner enables a fixed position of a workpiece always to be located at an equivalent position in view of crystallography of the workpiece, and enables a product sliced out from the workpiece to be processed in an arrangement in which breakage is the hardest to occur. Especially, a silicon single crystal has an arrangement of cleavage plane for each crystal axis orientation, which can be known from a relative position between an OF or a notch and a central axis passing through midpoints of the bottoms.

CITATION LIST

Patent Literature

Patent Document 1: Japanese Unexamined Patent publication (Kokai) No. 2007-90466

SUMMARY OF INVENTION

Technical Problem

However, some orientation measuring instruments have a limitation on the distance between a measuring portion of the orientation measuring instrument and a workpiece bottom. In particular, a workpiece having a length three fourth or less of a processable maximum length (a length of a workpiece holder) cannot be subjected to an orientation measurement unless the workpiece is brought and fixed to one side of the workpiece holder. Therefore, it has been necessary to slice the workpiece while keeping the workpiece at one side of a wire row of a wire saw. In this method, the workpiece is not always symmetrically pressed against the wire row from the beginning of slicing, thus causing variation in processing pressure and varied displacement in the workpiece. Accordingly, a problem of degradation of warpage occurs.

The present invention was accomplished in view of the above-described problems. It is an object of the present invention to provide a method for slicing a workpiece and a workpiece holder that allow an orientation measurement regardless of the limitation on the distance between a measuring portion of an orientation measuring apparatus and a plane to be measured of a workpiece, and can inhibit workpiece breakage and warpage degradation caused when the workpiece is sliced.

Solution to Problem

To achieve this object, the present invention provides a method for slicing a workpiece, comprising: measuring a crystal axis orientation while holding a cylindrical workpiece with a workpiece holder; setting the workpiece holder holding the workpiece to a wire saw in such a manner that the measured crystal axis orientation is maintained; then adjusting a sliced plane orientation; and pressing the workpiece held with the workpiece holder against a wire row to slice the workpiece, the wire row being formed by winding a wire axially reciprocating around a plurality of grooved rollers, wherein the workpiece holder includes a slide portion being slidable while holding the workpiece and a fix portion for fixing the slide portion, and the method includes, after measuring the crystal axis orientation, sliding the slide portion so as to move the workpiece to a center of the workpiece holder in such a manner that the measured crystal axis orientation is maintained, fixing the slide portion with the fix portion, setting the workpiece holder holding the workpiece to the wire saw, then adjusting the sliced plane orientation, and pressing the workpiece against the wire row to slice the workpiece.

Such a method enables the crystal axis orientation of the workpiece to be measured without limiting the length of the workpiece in the measurement of the crystal axis orientation of the workpiece. The workpiece can be then sliced at the center of the wire row of the wire saw by moving the workpiece to the center of the workpiece holder in such a manner that the crystal axis orientation of the workpiece is maintained. Consequently, processing pressure is uniformly applied over the workpiece. Thus, a wafer having a sliced plane with a desired plane orientation can be sliced out while inhibiting warpage degradation and breakage of the wafer due to variation in the processing pressure.

In this method, the workpiece may have a length three fourth or less of a length of the workpiece holder, and the crystal axis orientation may be measured after sliding the slide portion holding the workpiece so as to bring an end face of the workpiece to one side of the workpiece holder.

Conventionally, when a short workpiece having a length three fourth or less of a length of the workpiece holder is subjected to an axis orientation measurement, the orientation cannot not be measured unless the short workpiece is brought and fixed to one side of the workpiece holder, because of the structure of an orientation measuring apparatus. Therefore, it has been necessary to slice the short workpiece while fixing it to one side of the workpiece holder. However, according to the inventive method for slicing a workpiece, the slide portion is shifted to move the short workpiece, whereby not only the orientation can be measured without limiting the length of the wafer, but also the workpiece can be sliced without variation in the processing pressure, even in the internal setup manner.

The workpiece may be a silicon single crystal ingot.

In the inventive method for slicing a workpiece, a short and large-diameter ingot of a silicon single crystal can be sliced into silicon wafers having large diameter with reduced warpage and breakage.

Furthermore, the present invention provides a workpiece holder for use in holding a cylindrical workpiece when a crystal axis orientation of the workpiece is measured and the workpiece is then sliced with a wire saw, the workpiece holder including a slide portion being slidable while holding the workpiece and a fix portion for fixing the slide portion, wherein, after measuring the crystal axis orientation of the workpiece, the slide portion is slidable so as to move the workpiece to a center of the workpiece holder in such a manner that the measured crystal axis orientation is maintained, and the fix portion can fix the slide portion, whereby the workpiece is held with the workpiece holder.

Such a workpiece holder enables the crystal axis orientation of the workpiece to be measured without limiting the length of the workpiece in the measurement of the crystal axis orientation of the workpiece. Moreover, the workpiece can be sliced at the center of the wire row of the wire saw by moving the workpiece to the center of the workpiece holder in such a manner that the crystal axis orientation of the workpiece is maintained. Consequently, processing pressure is uniformly applied over the workpiece. Thus, a wafer having a sliced plane with a desired orientation can be sliced out while inhibiting warpage degradation and breakage of the wafer due to variation in the processing pressure.

The fix portion may have a dovetail groove provided in parallel with a line connecting centers of both end faces of the workpiece, and the slide portion may be engaged with the dovetail groove, whereby the slide portion is slidable while maintaining the measured crystal axis orientation of the workpiece.

According to this configuration, the slide portion can be easily slid while maintaining the measured crystal axis orientation by a simple structure.

The workpiece to be held may have a length three fourth or less of a length of the workpiece holder.

The inventive workpiece holder enables, even when a subject to be held is a short workpiece having a length three fourth or less of a length of the workpiece holder, not only the orientation to be measured without limiting the length of the wafer, but also the workpiece to be sliced without variation in the processing pressure. Therefore, a wafer having a sliced plane with a desired orientation can be sliced out while inhibiting warpage degradation and breakage of the wafer due to variation in the processing pressure.

The workpiece to be held may be a silicon single crystal ingot.

Use of the inventive workpiece holder enables the workpiece of a silicon single crystal ingot, whose diameter tends to increase in recent years, to be sliced into silicon wafers having large diameter with reduced warpage and breakage, even if the workpiece is short.

Advantageous Effects of Invention

The method for slicing a workpiece and the workpiece holder of the present invention enable a crystal axis orientation of a workpiece to be measured without limiting the length of the workpiece in the measurement of the crystal axis orientation of the workpiece. Moreover, the workpiece can be sliced at the center of the wire row of the wire saw by moving the workpiece to the center of the workpiece holder in such a manner that the crystal axis orientation is maintained. As a result, a wafer having a sliced plane with a desired orientation can be sliced out while inhibiting warpage degradation and breakage of the wafer.

DESCRIPTION OF EMBODIMENTS

Hereinafter, embodiments of the present invention will be described, but the present invention is not limited thereto.

As mentioned above, there is a limitation on the distance between a measuring portion of an orientation measuring instrument and a workpiece bottom. Especially, a workpiece having a length three fourth or less of a length of the workpiece holder cannot be measured unless the workpiece is brought and fixed to one side of the workpiece holder. Therefore, when the sliced plane is adjusted in the internal setup manner, it has been necessary to slice the workpiece while keeping the workpiece at one side of the wire row, causing varied displacement in the workpiece. Accordingly, a problem of warpage degradation occurs.

In view of this, the present inventors diligently considered to solve this problem and consequently found the following: a workpiece holder including a slide portion configured to hold a workpiece and being slidable while maintaining the crystal axis orientation can move the workpiece while holding the workpiece. Such a workpiece holder enables, even if the workpiece has been brought to one side of the workpiece during a crystal axis orientation measurement, the workpiece to move the center of the workpiece holder at slicing. Thus, the workpiece can be sliced at a center of a wire row into wafers having a sliced plane with a desired orientation while inhibiting warpage degradation and breakage of the wafer. The inventors thereby brought the invention to completion.

Hereinafter, the inventive workpiece holder and the method for slicing a workpiece using this workpiece holder will be described with reference to FIGS. 1 to 7.

First, the inventive workpiece holder used in the inventive method for slicing a workpiece will be described.

The inventive workpiece holder is used for holding a workpiece when a crystal axis orientation of the workpiece is measured. Then, the workpiece holder is set to a wire saw while holding the workpiece, and used for holding the workpiece also when the workpiece is sliced.

Figure 1:
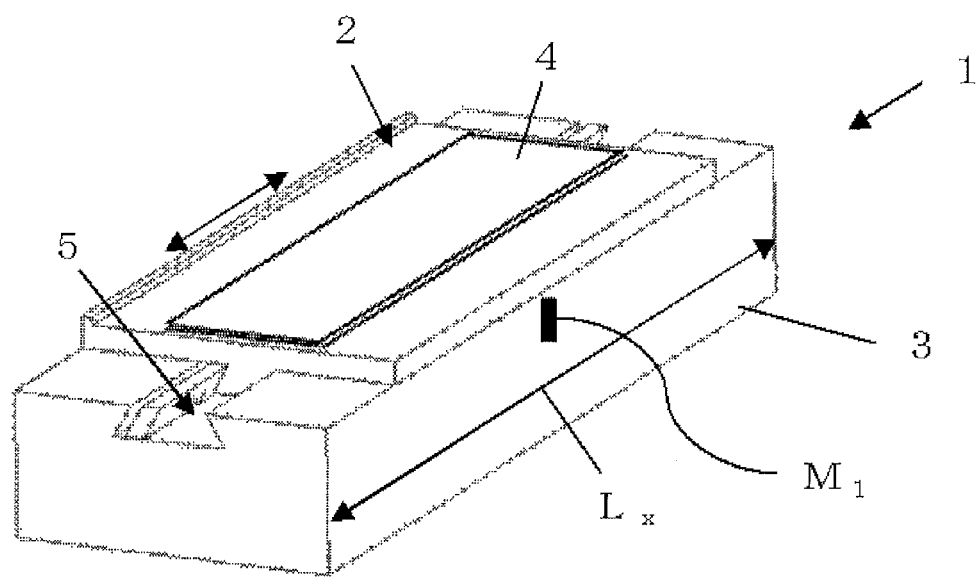
FIG. 1 is a schematic diagram showing an example of the inventive workpiece holder.

As shown in FIG. 1, the inventive workpiece holder 1 includes a slide portion 2 and a fix portion 3.

Figure 3:
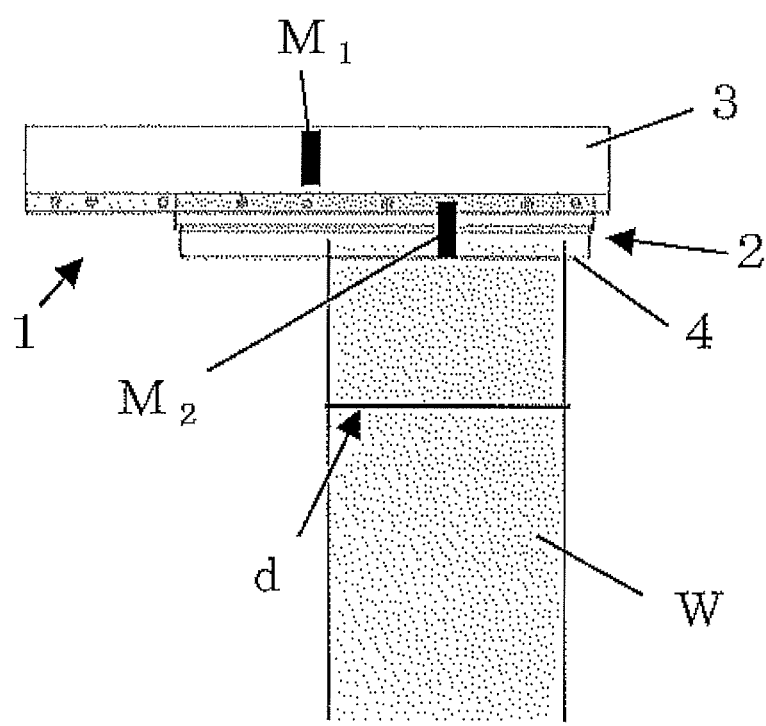
FIG. 3 is a schematic diagram showing an exemplary case in which a workpiece is brought to one side of the inventive workpiece holder.
Figure 4:
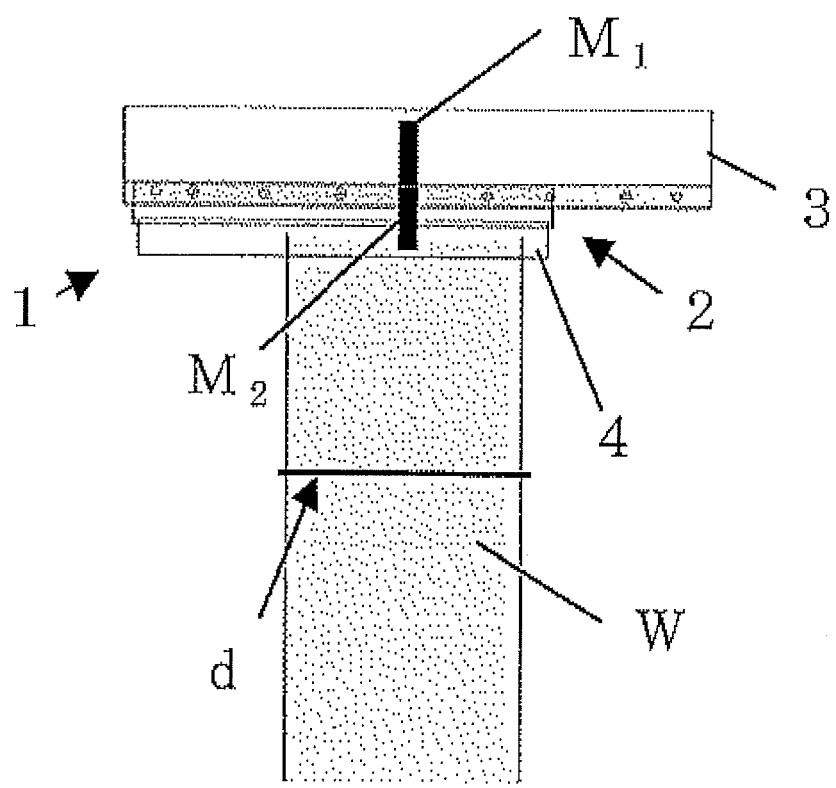
FIG. 4 is a schematic diagram showing an exemplary case in which a workpiece is moved to a center of the inventive workpiece holder.

As shown in FIGS. 3 and 4, the slide portion 2 can hold a workpiece W through a beam 4 bonded thereto, and can slide on the fix portion 3 while holding the workpiece W.

The fix portion 3 preferably has a dovetail groove 5 provided in parallel with a line connecting centers of both end faces of the held workpiece W, and the slide portion 2 may be engaged with the dovetail groove 5, whereby the slide portion 2 is slidable while maintaining the measured crystal axis orientation of the workpiece W.

According to this configuration, the slide portion can be easily slid while maintaining the measured crystal axis orientation by a simple structure.

Figure 2:
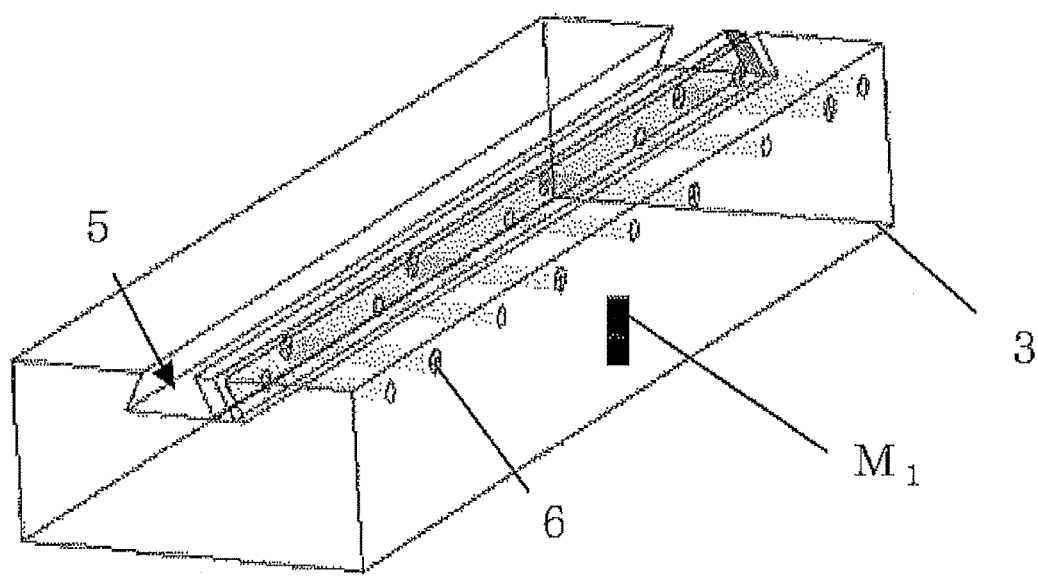
FIG. 2 is a schematic diagram showing an example of the fix portion of the inventive workpiece holder.

As shown in FIG. 2, fixing screws 6 are provided so as to pierce from a side face of the fix portion 3 to the dovetail groove 5, and the slide portion 2 engaged with the dovetail groove 5 is fixed to the fix portion 3 with the fixing screws 6.

In particular, the workpiece holder 1 is suitably used for holding a short workpiece W having a length three fourth or less of a length of the workpiece holder 1.

In the measurement of a crystal axis orientation, the inventive workpiece holder 1 enables, even when the subject is a short workpiece, the crystal axis orientation to be measured after sliding the slide portion 2 holding the workpiece W so as to bring an end face of the workpiece W to one side of the workpiece holder 1, as shown in FIG. 3. Then, as shown in FIG. 4, the short workpiece W can be moved to a center of the workpiece holder 1 and then fixed while being held to slice the workpiece W with a wire saw.

As shown in FIGS. 3 and 4, a center mark $M_1$ may be put at a midpoint of the length of the fix portion 3, and a center mark $M_2$ for indicating a midpoint of the workpiece may be put on the slide portion 2, previously. When the slide portion 2 is slid such that the center marks $M_1$, $M_2$ coincide with each other as shown in FIG. 4, the short workpiece W can be accurately moved to the center of the workpiece holder 1.

Moreover, the workpiece to be held with the workpiece holder 1 may be a silicon single crystal ingot.

As the diameter of a silicon single crystal ingot increases, it is often required to slice a short ingot with large diameter. In this case, when the workpiece holder 1 like the present invention is used, a silicon wafer having large diameter can be obtained with reduced warpage and breakage. Of course, the workpiece to be sliced is not limited to a silicon single crystal, and may be any of a compound semiconductor, an oxide single crystal, quartz, and so on.

Next, the inventive method for slicing a workpiece using the inventive workpiece holder 1 will be described.

First, in order to slice the workpiece precisely, a workpiece is bonded to a beam 4, whereby the workpiece W is held with a slide portion 2 of a workpiece holder 1. At this time, the workpiece W is bonded at an angle furthest from a crystal habit line of the workpiece with respect to the lower surface of the slide portion 2. In other words, the workpiece W is preferably bonded to the beam 4 at such an angle that the cleavage direction is sufficiently separated from the wire travelling direction. In this manner, cracking of wafers hardly occurs since the cleavage direction can be sufficiently separated from the wire travelling direction during slicing. In this case, an alignment based on a notch d or an OF is possible since the crystal habit line is already removed from the workpiece by cylindrical grinding or other method.

Figure 5:
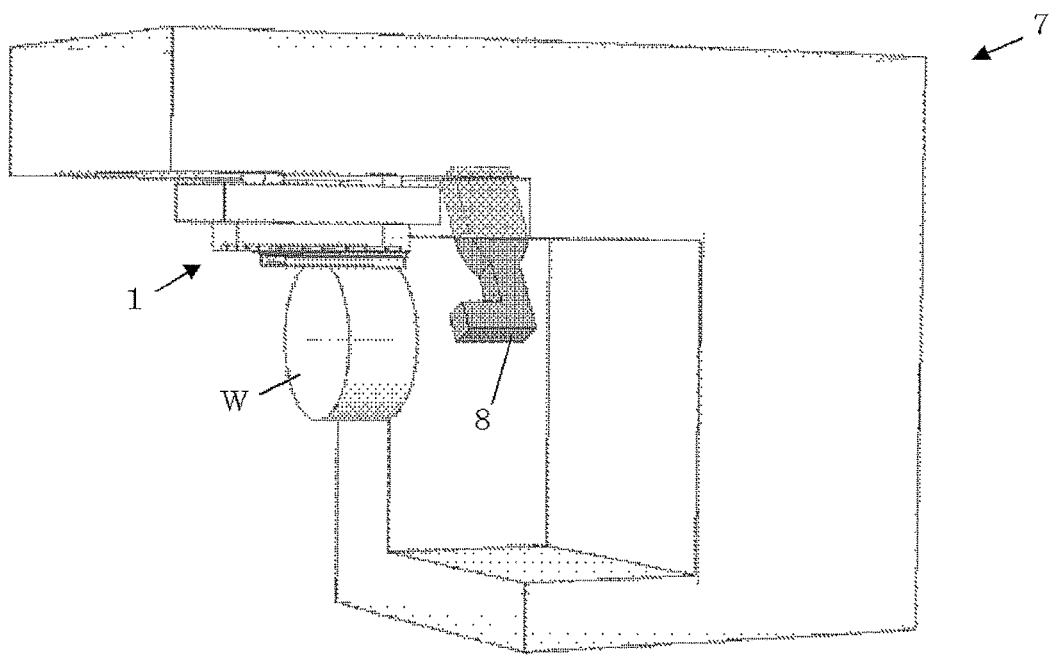
FIG. 5 is a schematic diagram showing an exemplary case in which the inventive workpiece holder is set to a crystal orientation measuring instrument.

Then, the workpiece holder 1 holding the workpiece W is set to an orientation measuring apparatus 7 as shown in FIG. 5.

Figure 6:
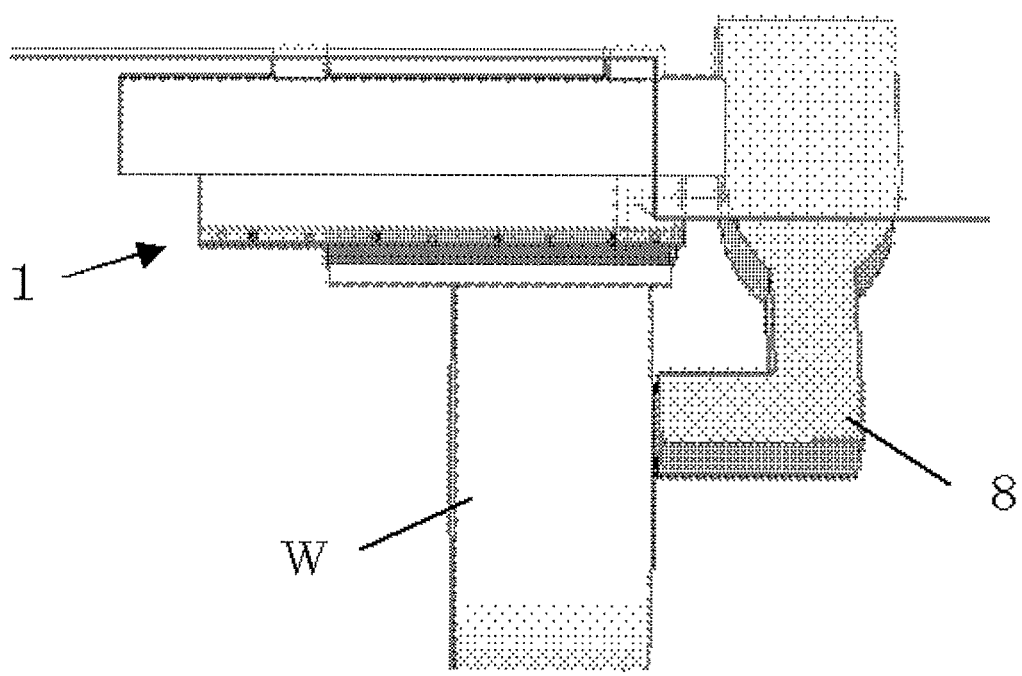
FIG. 6 is a schematic diagram showing an exemplary case in which a crystal orientation axis is measured while holding a workpiece with the inventive workpiece holder.

In this operation, as shown in FIG. 6, one end face of the workpiece W is brought close to an orientation measuring portion 8, which is capable of measuring a crystal axis orientation of a workpiece W close within a certain distance, to measure the crystal axis orientation.

Figure 7:
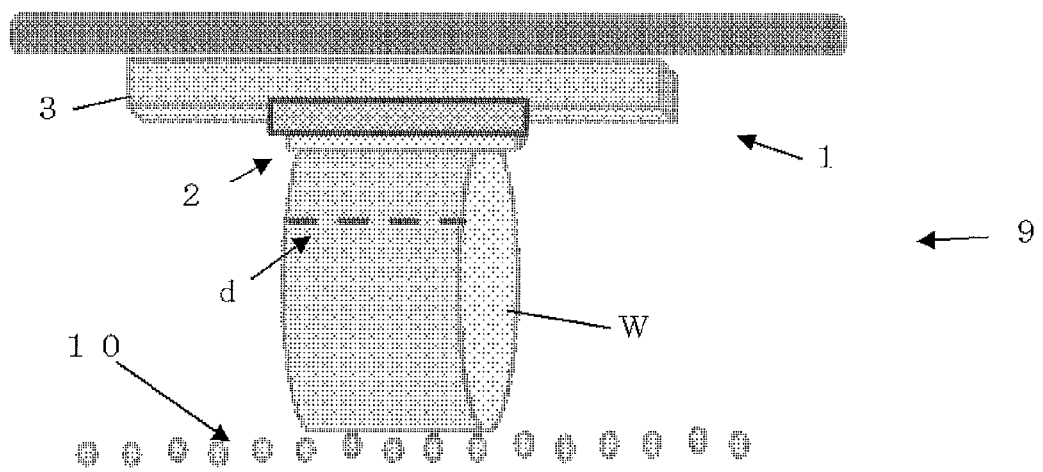
FIG. 7 is a schematic diagram showing an exemplary case in which a workpiece held with the inventive workpiece holder is sliced.

After measuring the crystal axis orientation, the slide portion 2 of the workpiece holder 1 is slid so as to move the workpiece W to the center of the workpiece holder in such a manner that the measured crystal axis orientation is maintained. In this operation, as shown in FIG. 4, when the above-mentioned center marks $M_1$, $M_2$ are put as marks and the slide portion is moved to a position where both marks are matched, the workpiece W can be easily moved to the center of the workpiece holder while maintaining the measured crystal axis orientation. Then, after the slide portion 2 is fixed with fixing screws 6 of a fix portion 3, the workpiece holder 1 is set to a wire saw 9, as shown in FIG. 7. The wire saw 9 is provided with a wire row 10 formed by winding a wire axially reciprocating around a plurality of grooved rollers (not shown). The workpiece holder 1 is located over the wire row 10.

Then, the position of the workpiece W is adjusted such that the crystal axis orientation of the workpiece W coincides with a desired plane orientation of the wafer after slicing, by a combination of a rotating motion around an axis perpendicular to a central axis between the bottoms (between both end faces) of the workpiece W in a plane parallel to the wire row 10 and a swinging motion to rotate the central axis between the bottoms in a plane perpendicular to the wire row 10. Even after the workpiece holder 1 is fixed to the wire saw 9, the adjustment of the sliced plane orientation of the workpiece can be performed by using, for example, a wire saw equipped with a tilt mechanism.

Thereafter, the workpiece W is moved downwardly and pressed against the wire row 10 to slice the workpiece W.

As mentioned above, the inventive method for slicing a workpiece enables a measurement of the crystal axis orientation without limiting the length of the workpiece W in the measurement of the crystal axis orientation. Then, the workpiece W is moved to the center of the workpiece holder 1 in such a manner that the crystal axis orientation of the workpiece W is maintained, whereby the workpiece can be sliced at the center of the wire row 10 of the wire row 9. As a result, processing pressure is uniformly applied over the workpiece. Thus, a wafer having a sliced plane with a desired plane orientation can be sliced out while inhibiting warpage deterioration and breakage of the wafer due to variation in the processing pressure.

Moreover, when the crystal axis orientation is measured, the workpiece W may have a length there fourth or less of a length of the workpiece holder, and the crystal axis orientation may be measured after sliding the slide portion holding the workpiece so as to bring an end face of the workpiece to one side of the workpiece holder.

Conventionally, in the internal setup manner, when a short workpiece having a length three fourth or less of a length of the workpiece holder is subjected to an axis orientation measurement, the orientation cannot not be measured unless the short workpiece is brought and fixed to one side of the workpiece holder, because of the structure of an orientation measuring apparatus. Therefore, it has been necessary to slice the short workpiece while fixing it to one side of the workpiece holder. However, according to the inventive method for slicing a workpiece, the slide portion is shifted to move the short workpiece, whereby not only the orientation can be measured regardless of the length of the wafer, but also the workpiece can be sliced without variation in the processing pressure.

Moreover, the workpiece W may be a silicon single crystal ingot.

The diameter of a silicon single crystal ingot tends to increase in recent years, and thus it is often required to slice a short ingot with large diameter. Even in this case, the inventive method for slicing a workpiece in the internal setup manner can provide silicon wafers with reduced warpage and breakage since the arrangement of the cleavage plane can be easily known from a crystal habit line.

EXAMPLE

Hereinafter, the present invention will be more specifically described with reference to examples and comparative examples, but the present invention is not limited thereto.

Examples 1 to 5

By using a workpiece holder 1 as shown in FIG. 1, a workpiece was brought to one side of the workpiece holder as shown in FIG. 6 to measure a crystal axis orientation. Then, the slide portion was slid so as to move to the center of the workpiece holder in such a manner that the measured crystal axis orientation was maintained, and the slide portion was fixed with the fix portion. The workpiece holder was then set to a wire saw as shown in FIG. 7, a sliced plane orientation was adjusted, and the workpiece was pressed against a wire row and sliced. The workpiece to be sliced was a silicon single crystal ingot having a diameter of 200 mm and a length ratio (%) with respect to the length of the workpiece holder (a length shown by Lx in FIG. 1) of ¾ (=0.75) or less. The silicon single crystal ingot having a length ratio (length of workpiece/length of workpiece holder) of 0.60 (example 1), 0.51 (example 2), 0.45 (example 3), 0.30 (example 4), or 0.24 (example 5) was repeatedly sliced into wafers.

After completion of slicing, Warp, which is an index showing degree of warpage of a wafer, was measured with a wafer shape measuring instrument, MX204-8-37, made by E+H Metrology GmbH.

Figure 8:
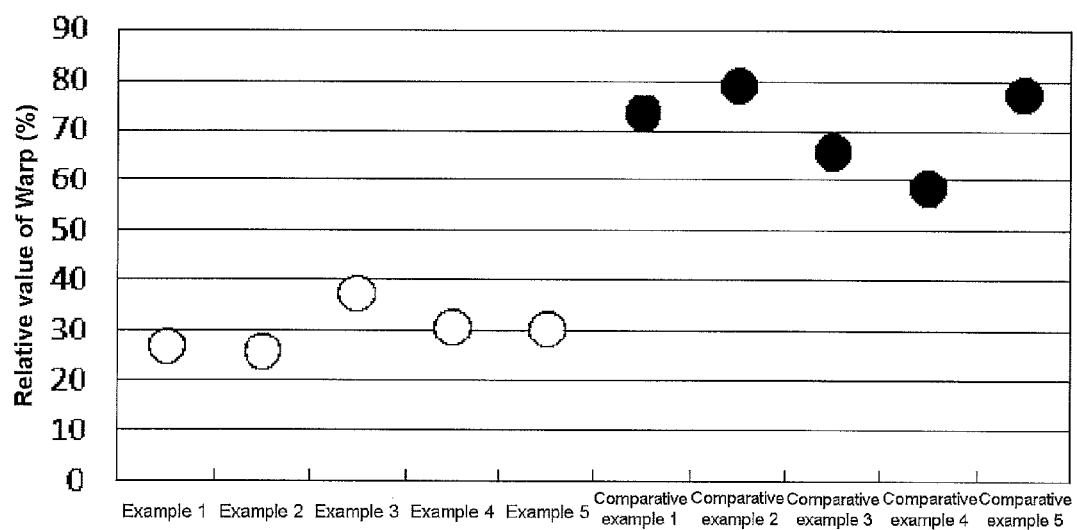
FIG. 8 is a diagram showing a relative value of Warp in examples and comparative examples.
Figure 9:
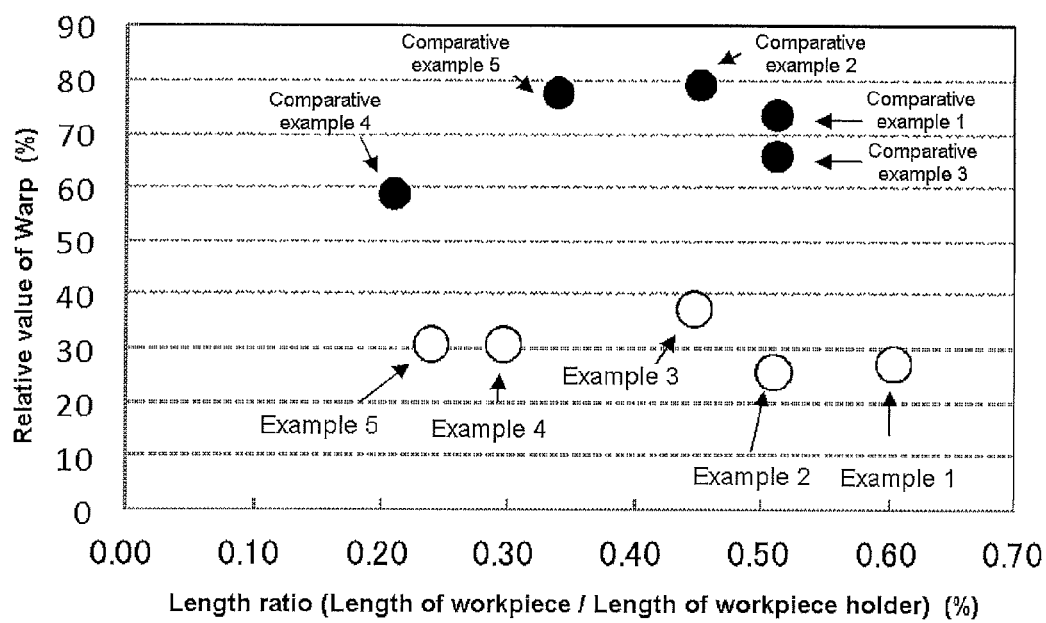
FIG. 9 is a diagram showing a relationship between the relative value of Warp and a length ratio in examples and comparative examples.

The result is shown in Table 1, FIG. 8, and FIG. 9. In examples and comparative examples, a relative value (%) of Warp expressed by (Average value of Warp of wafers sliced out from individual workpiece)/(Maximum value of Warp in comparative example)×100 was used as an evaluation index of Warp.

As shown in Table 1, FIG. 8, and FIG. 9, the relative values of Warp in examples 1 to 5 were almost half or less of the values in comparative examples described later, and it was confirmed that the flatness was improved. Accordingly, it was confirmed that a short workpiece having a length three fourth or less of the length of the workpiece holder could be sliced as well as a workpiece having a usual length, while inhibiting deterioration of warpage of the wafers compared with the conventional slicing method.

Comparative Examples 1 to 5

A workpiece was sliced under the same condition as in examples except that the inventive workpiece holder was not used. That is, the workpiece was brought to one side of the workpiece holder to allow a measurement of the crystal axis orientation of the short workpiece, and sliced while keeping the workpiece at one side. Then, Warp of the wafers was evaluated in the same manner as in examples.

In comparative examples 1 to 5, the silicon single crystal ingot having a length ratio of 0.51 (comparative example 1), 0.45 (comparative example 2), 0.51 (comparative example 3), 0.21 (comparative example 4), or 0.34 (comparative example 5) was repeatedly sliced into wafers.

The result is shown in Table 1, FIG. 8, and FIG. 9. In comparative examples 1 to 5, the workpiece could not be sliced at the center of the wire raw, and the processing pressured was not uniformly applied over the workpiece. Therefore, the relative value of Warp was almost two times as large as examples, and it was confirmed that the flatness was deteriorated, compared with examples.

The results of examples and comparative examples are summarized in Table 1.

TABLE 1

| | Length ratio(%) | Relative value of Warp (%) |
|---|---|---|
| Example 1 | 0.60 | 26.9 |
| Example 2 | 0.51 | 25.7 |
| Example 3 | 0.45 | 37.4 |
| Example 4 | 0.30 | 30.6 |
| Example 5 | 0.24 | 30.4 |
| Comparative example 1 | 0.51 | 73.4 |
| Comparative example 2 | 0.45 | 78.9 |
| Comparative example 3 | 0.51 | 65.9 |
| Comparative example 4 | 0.21 | 58.6 |
| Comparative example 5 | 0.34 | 77.3 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A method for slicing a workpiece, comprising: measuring a crystal axis orientation while holding a cylindrical workpiece with a workpiece holder; setting the workpiece holder holding the workpiece to a wire saw in such a manner that the measured crystal axis orientation is maintained; then adjusting a sliced plane orientation in the wire saw; and pressing the workpiece held with the workpiece holder against a wire row to slice the workpiece, the wire row being formed by winding a wire axially reciprocating around a plurality of grooved rollers, wherein
the workpiece holder includes a slide portion being slidable while holding the workpiece and a fix portion for fixing the slide portion, and the method includes, after measuring the crystal axis orientation, sliding the slide portion so as to move the workpiece to a center of the workpiece holder in such a manner that the measured crystal axis orientation is maintained, fixing the slide portion with the fix portion, setting the workpiece holder holding the workpiece to the wire saw, then adjusting the sliced plane orientation in the wire saw, and pressing the workpiece against the wire row to slice the workpiece.

2. The method for slicing a workpiece according to claim 1, wherein the workpiece has a length three fourth or less of a length of the workpiece holder, and the crystal axis orientation is measured after sliding the slide portion holding the workpiece so as to bring an end face of the workpiece to one side of the workpiece holder.

3. The method for slicing a workpiece according to claim 1, wherein the workpiece is a silicon single crystal ingot.

4. The method for slicing a workpiece according to claim 2, wherein the workpiece is a silicon single crystal ingot.

5. A workpiece holder for use in holding a cylindrical workpiece when a crystal axis orientation of the workpiece is measured and the workpiece is then sliced with a wire saw, the workpiece holder including a slide portion being slidable while holding the workpiece and a fix portion for fixing the slide portion, wherein, after measuring the crystal axis orientation of the workpiece, the slide portion is slidable so as to move the workpiece to a center of the workpiece holder in the wire saw in such a manner that the measured crystal axis orientation is maintained, and the fix portion can fix the slide portion, whereby the workpiece is held with the workpiece holder.

6. The workpiece holder according to claim 5, wherein the fix portion has a dovetail groove provided in parallel with a line connecting centers of both end faces of the workpiece, and the slide portion is engaged with the dovetail groove, whereby the slide portion is slidable while maintaining the measured crystal axis orientation of the workpiece.

7. The workpiece holder according to claim 5, wherein the workpiece to be held has a length three fourth or less of a length of the workpiece holder.

8. The workpiece holder according to claim 6, wherein the workpiece to be held has a length three fourth or less of a length of the workpiece holder.

9. The workpiece holder according to claim 5, wherein the workpiece to be held is a silicon single crystal ingot.

10. The workpiece holder according to claim 6, wherein the workpiece to be held is a silicon single crystal ingot.

11. The workpiece holder according to claim 7, wherein the workpiece to be held is a silicon single crystal ingot.

12. The workpiece holder according to claim 8, wherein the workpiece to be held is a silicon single crystal ingot.

13. The method for slicing a workpiece according to claim 1, wherein
the fix portion and the slide portion respectively have a first center mark for indicating a midpoint of a length of the fix portion and a second center mark for indicating a midpoint of the workpiece, and
the slide portion is slid such that the first and the second center marks coincide with each other.

14. The workpiece holder according to claim 5, wherein
the fix portion and the slide portion respectively have a first center mark for indicating a midpoint of a length of the fix portion and a second center mark for indicating a midpoint of the workpiece, and
the slide portion is slid such that the first and the second center marks coincide with each other.

* * * * *